(12) United States Patent
Rangwalla et al.

(10) Patent No.: US 12,719,016 B2
(45) Date of Patent: Aug. 25, 2026

(54) ELECTRON BEAM CURING OF CLEAR AND PIGMENTED COATINGS FOR THE COIL INDUSTRY AND METHOD THEREOF

(71) Applicant: Energy Sciences Inc., Wilmington, MA (US)

(72) Inventors: Imtiaz Rangwalla, Andover, MA (US); Robert Couilliard, Plaistow, NH (US); Richard Alexy, Auburndale, MA (US)

(73) Assignee: Energy Sciences Inc., Wilmington, MA (US)

(*) Notice: Subject to any disclaimer, the term of this patent is extended or adjusted under 35 U.S.C. 154(b) by 292 days.

(21) Appl. No.: 18/477,460

(22) Filed: Sep. 28, 2023

(65) Prior Publication Data

US 2025/0112025 A1 Apr. 3, 2025

(51) Int. Cl.
*H01J 37/317* (2006.01)

(52) U.S. Cl.
CPC ..... *H01J 37/317* (2013.01); *H01J 2237/3156* (2013.01)

(58) Field of Classification Search
CPC ...... H01J 37/317; H01J 37/304; H01J 37/305; H01J 2237/3156; B05D 3/068; B05D 2252/02
See application file for complete search history.

(56) References Cited

U.S. PATENT DOCUMENTS 4,521,445 A 6/1985 Nablo et al.
6,488,993 B2 * 12/2002 Madigan .................. B05D 7/14 427/551
2007/0187027 A1 * 8/2007 Tausch ................ B41F 23/0409 156/359
2022/0274429 A1 * 9/2022 Kakimoto ............ B41J 13/0009

FOREIGN PATENT DOCUMENTS

EP 0122998 B1 9/1989
JP 2014189631 A * 10/2014
WO 2025/072769 A1 4/2025

OTHER PUBLICATIONS

Ebeam Metal Coil Coating: Cleveland Steel Container Case Study, RadTech Europe Conference 2019 (Year: 2019).*
Ebeam Metal Coil Coating: Cleveland Steel Contain Case Study, RadTech European Conference 2019 (Year: 2019).*
International Search Report and Written Opinion received for PCT Patent Application No. PCT/US2024/048987, mailed on Jan. 17, 2025, 12 pages.

* cited by examiner

*Primary Examiner* — David E Smith
(74) *Attorney, Agent, or Firm* — Hamilton, Brook, Smith & Reynolds, P.C.

(57) ABSTRACT

A method and an apparatus are provided for Electron Beam (EB) curing of coils that are coated with energy cured resins. The apparatus comprises a curing assembly, a microprocessor unit, one or more sensors, and a user interface. The curing assembly comprises of a fixed part and a movable part. The fixed part comprises a rotator and a first moving means. The movable part comprises of an accelerator. The fixed part and the movable part are movably coupled to each other using a coupler. The coupler is configured to move using a second moving means. The curing assembly is communicatively coupled to the microprocessor unit. The coil comes at the input gate at the fixed part of the curing assembly for the curing purposes and exits through the output gate at the fixed part of the apparatus after being cured.

19 Claims, 5 Drawing Sheets

ELECTRON BEAM CURING OF CLEAR AND PIGMENTED COATINGS FOR THE COIL INDUSTRY AND METHOD THEREOF

FIELD OF THE INVENTION

Embodiments described herein in general, concern methods and apparatus for curing of coils. More particularly, the embodiments concern methods and apparatus for electron beam curing of clear and pigmented coatings for the coil.

BACKGROUND

Unless otherwise indicated herein, the approaches described in this application are not considered prior art against the claims in this application.

Steel is made up of iron and has been used from years for a large scale of applications including, buildings, infrastructure, tools, ships, trains, cars, machines, electrical appliance, weapons, and rockets. In almost all applications, steel is galvanized for further use. Some examples of galvanized steel are in the form of coils used in commercial or industrial applications. Some exemplary uses of such coils are in applications such as construction, roofing, home and office appliances, transportations, furniture, and the like. Galvanized coil is made up of steel with a layer of zinc on its surface. Galvanizing is an economical and effective anticorrosion method that is often used for keeping the coils safe. The galvanized coils are coated with clear or pigmented coatings for protecting the coils from the environment and to maintain their aesthetics by providing resistance to scratch and abrasions. This can be achieved by roll a coating method or spray coating methods. Generally, the roll of coil that is to be coated is around 1.2 to 2.5 meters wide and coated with a velocity of 90 to 150 meters/min in a continuous process. The thickness of the coat or the paint varies from 100 to 150 micrometers, depending upon the application. Once the coil is coated, it needs to be dried in the dryer. Generally, a drying tunnel is used for drying of the coated coil. The drying tunnel is several meters long. The drying tunnel functions as a long drying oven. The coil to be coated is introduced into the drying tunnel. In addition to the coil, the tunnel carries water or solvent that accounts for about 50 to 70 percent by weight. Thus, preparation of the coils in the drying tunnels can take some significant time. The paint used for coating generally includes 30 percent solids. Hence, the coating of the coil results in a dry weight of about 30 to 45 micrometers. Further, the drying of the paint is a long process. Such processes require long ovens providing hot air, which is heated by natural gas. These processes result in a very high carbon footprint and hence, may defeats sustainability mandates.

Introduction of energy cured resins in the field of coil coating results in reduced energy consumption by almost 9 times as compared to the solvent or water-based systems. Energy cured resins are available as 100 percent solids containing monomers or oligomers, requiring electrons or photons. Some examples of such systems are Ultra-Violet (UV) curing systems and Electron Beam (EB) curing systems. In UV curing systems, the energy cured resins require photons that are generated by UV rays in the presence of photo initiators, whereas in the EB curing systems, electrons are created by electron beam (EB) accelerators. The electrons have enough ionization potential to initiate free radicals and propagate polymerization reactions without requiring photo initiators. Conventional paint for curing contains about 30 to 50 percent solids, which takes a long duration to dry in huge dryers for drying the paint while the EB curing is 100 percent solids. EB curing requires energy about 10 to 20 percent of the total energy required in conventional solvent/water-based paints. EB curing is preferred for applications of coils coating. Generally, an EB curing system includes a movable and a stationary self-shield, an EB accelerator, and a high voltage source.

In the curing process, the coils to be coated, need to be painted first with energy curable resins. The coils are in the form of long sheets of galvanized steel and the process of painting the coils is a continuous process. It involves rolls of coils to be spliced one over the another for connecting two or more rolls together for the coating process. The interconnection or splice of the two rolls of coils causes the joint to have a width. The width generally varies between 30 mm to 50 mm. The rolls of coils with the interconnecting splice need to pass through the EB accelerator for the EB curing process. The splice is wider than an entrance area of the EB accelerator. Hence, as the splice approaches the EB accelerator, the movable self-shield of the EB accelerator is open to create the required space for the splice to pass through. During this time period, the beam current, nitrogen injection, and voltage of the EB accelerator are all turned off, which in turn results in the stopping of the curing process. As the coils to be cured are still being continuously passed through the EB accelerator when such parameters are turned off, a certain amount of coil is passed through the apparatus without being cured. Hence, such coil is wasted.

Therefore, there exists a long-felt but unresolved need for an improved apparatus and method for the curing of coils which results in less wastage of the steel coils.

SUMMARY OF THE INVENTION

While the way that the present disclosure addresses the disadvantages of the prior art will be discussed in greater detail below, in general, the present disclosure provides a device attachable to a vehicle for lifting objects.

An object of the present disclosure is to provide an apparatus for curing coils using an electron beam (EB).

Another object of the present disclosure is to provide an apparatus which minimizes coils wastage during curing.

Yet another object of the present disclosure is to provide a method for Electron beam (EB) curing of the coils that are coated with energy cured resins.

Yet another object of the present disclosure is to provide a method for curing to achieve less wastage of the coil.

Yet another object of the present disclosure is to provide a method for curing which attains a steady state condition quickly.

Yet another object of the present disclosure is to provide a method which is more efficient.

The apparatus in accordance with the present disclosure may comprise a curing assembly for curing using Electron Beam (EB), a microprocessor unit, a user interface and one or more sensors. Further, the curing assembly may comprise a fixed part and a movable part. The fixed part may comprise an input gate for feeding the coils to be cured and an output gate for exit of the coils that are cured. The apparatus may further comprise a processing zone between the input gate and the output gate. The processing zone may comprise one or more injecting elements for injecting nitrogen gas into the apparatus. The processing zone may comprise an emission zone. The emission zone may be defined as a region of the processing zone in which the electrons are emitted onto the coil. In other words, the emission zone corresponds to a region where the coil is being cured. The fixed part may further comprise a rotator. The rotator may be configured to be rotated using a first moving means.

In an embodiment, the fixed part and the movable part may be coupled to each other via a coupler. The movable part may be configured to be displaced with respect to the fixed part using a second moving means. The movable part may comprise an accelerator. The accelerator may be configured to emit electrons onto the coil for curing. The accelerator may comprise a chamber, a window, and a foil. The chamber may include a plurality of components. The plurality of components of the chamber may include a repeller plate, an electron gun assembly, and a filament. The accelerator may be configured to provide a high intensity electron beam to the coil using the electron gun assembly and the filament. The repeller plate may be configured to repel the electrons that are bounced back to the chamber. The high intensity electron beam travels through the window and passes through the foil to strike and get absorbed in the coil for curing.

In an embodiment, the microprocessor unit may be configured to control the operation of the apparatus by transmitting and receiving signals corresponding to a voltage, a beam current, a rotator, a coupler and concentrations of nitrogen and oxygen gases. The one or more sensors may be configured to monitor the concentrations of nitrogen and oxygen gases in the processing zone. The user interface may be accessible to a user for controlling the operation of the apparatus.

The method in accordance with the present disclosure may comprise two stages, a first stage corresponding to a normal operation and a second stage corresponding to a splice operation. In the normal operation, the microprocessor unit may be configured to generate a first set of signals. In an exemplary embodiment, the first set of signals may include a first speed signal, a first displacement signal, a first beam signal and a first concentration signal. The first set of signals may be transmitted to the curing assembly for normal operation. In an embodiment, during the normal operation, the coil to be cured enters at the processing zone at a first speed, with the movable part placed at a first position, the concentration of oxygen is at a first level and the beam current is turned ON. Such conditions provide curing of the coil with a dose of electrons that is required for curing.

In the second stage of the operation, the method may include step of detecting an arrival of a splice. A splice is a part of the coil where an end of a first coil is attached or joined to a start of a second coil. Generally, in the part of the coil having splice, a thickness of the coil increases. When the splice arrives at the input gate of the apparatus, one or more signals are generated and transmitted to the microprocessor unit. The microprocessor unit may generate a second set of signals on arrival of the splice. The second set of signals may include a second speed signal, a second beam signal, a second concentration signal and a second displacement signal. In the second stage of operation, the speed of the rotator is changed to a second speed, the beam current is turned OFF, the concentration of oxygen is brought to the second level and the movable part is displaced to the second position. In an embodiment, the microprocessor unit may receive a signal via the user interface indicating an exit of the splice through the processing zone. In another embodiment, the microprocessor unit may automatically generate one or more signals which are used to bring the apparatus in the steady state condition. Accordingly, after the splice passes through the processing zone, the normal operation of the apparatus is resumed.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION OF THE INVENTION

Embodiments detailed herein are best understood by reference to the figures and descriptions set forth herein. All the aspects of the embodiments described herein will be better appreciated and understood when considered in conjunction with the following description and the accompanying figures. It should be understood, however, that the following descriptions, while indicating preferred embodiments and numerous specific details thereof, are given by way of illustration and not of limitation. Many changes and modifications may be made within the scope of the embodiments herein without departing from the spirit and scope thereof, and the embodiments herein include all such modifications.

As used herein, the term 'exemplary' or 'illustrative' means 'serving as an example, instance, or illustration.' Any implementation described herein as exemplary or illustrative is not necessarily to be construed as advantageous and/or preferred over other embodiments. Unless the context requires otherwise, throughout the description and the claims, the word 'comprise' and variations thereof, such as 'comprises' and 'comprising' are to be construed in an open, inclusive sense, i.e., as 'including, but not limited to.'

This disclosure is generally drawn, inter alia, to methods, apparatuses, systems, and devices implemented as automated tools for continuous processing of coils using energy cured resins using Electron Beam (EB).

Figure 1:
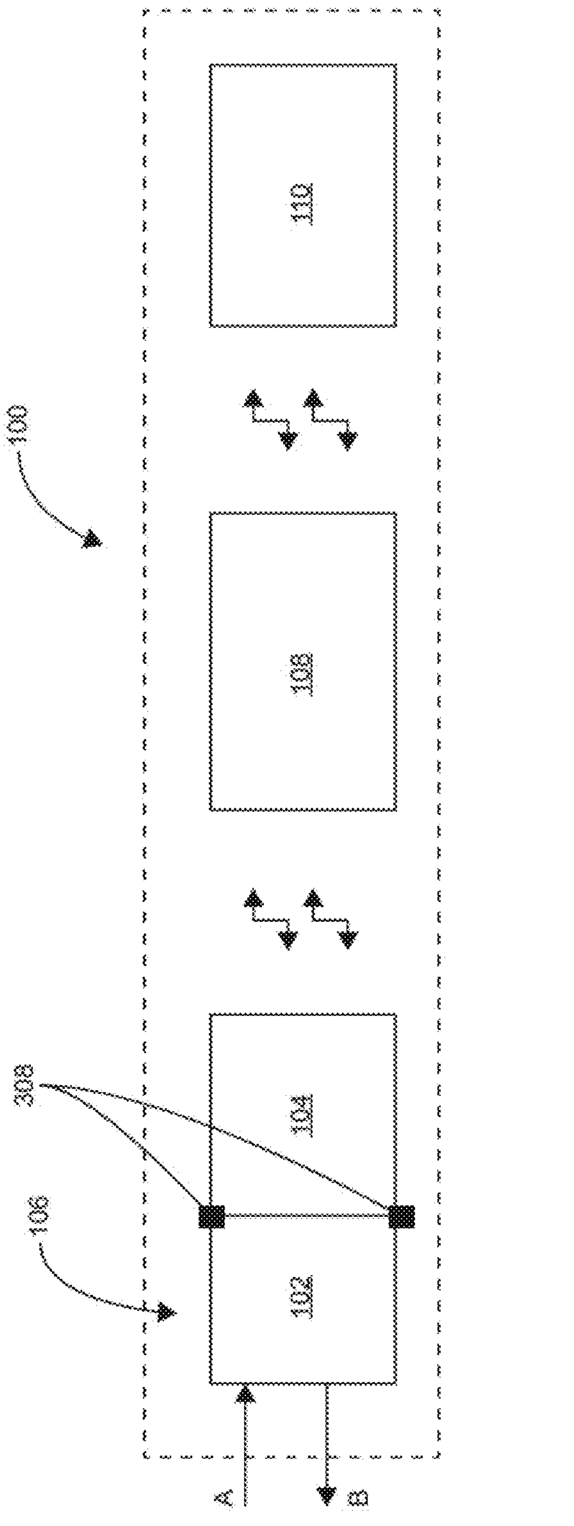
FIG. 1 schematically shows an exemplary block diagram representation of an apparatus for curing of the coils using Electron Beam (EB) in accordance with the present disclosure.

Reference is made to FIG. 1 which discloses an exemplary block diagram of an apparatus 100 for curing of coils using Electron Beam (EB) in accordance with the present disclosure. The coils are referred as long metal sheets which are in the form of rolls. Generally, a width of such a roll is 1.2-2.5 meters, and the thickness of the coil is around 1.5 mm-2.5 mm. To make the curing operation a continuous process, two or more such coils are joined together.

For curing of such coils, the apparatus 100 may comprise a curing assembly 106, a microprocessor unit 108, one or more sensors (not shown), and a user interface 110. The curing assembly 106 may be configured to perform curing of the coils that are coated using energy cured resins. The curing assembly 106 may comprise a fixed part 102, a movable part 104, and a processing zone (not shown) therewithin. In an embodiment, the fixed part 102 may be configured to be stationary and may comprise a rotator 306, an input gate 302, and an output gate 304 (seen in FIGS. 3-4).

Figure 3:
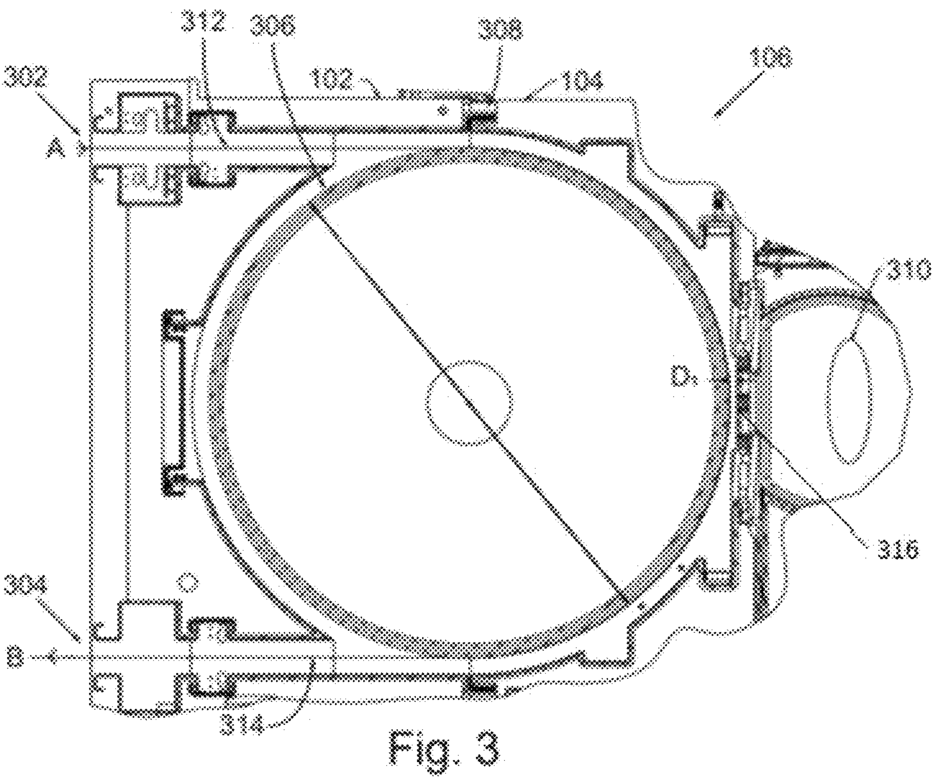
FIG. 3 schematically shows a cross-sectional view of a curing assembly of an exemplary apparatus for curing of coils in a first position during a first stage of operation in accordance with the present disclosure.
Figure 4:
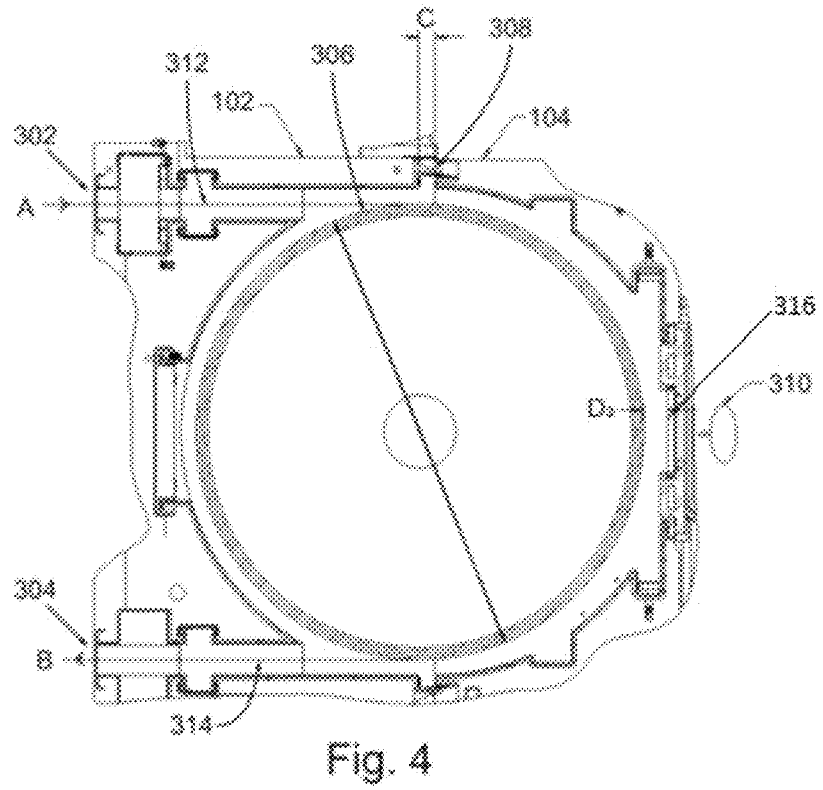
FIG. 4 schematically shows a cross-sectional view of a curing assembly of an exemplary apparatus for curing of coils in a second position during a second stage of operation in accordance with the present disclosure.

Referring additionally to FIGS. 3-4, the input gate 302 may be configured to receive the coils to be cured, and the output gate 304 may be configured to output the coils that are cured from the apparatus 100. The coils which are to be cured are rolled over the rotator 306. Hence, in a curing operation, the coils enter through the input gate 302, roll over the rotator 306, and exit through the output gate 304.

In an embodiment, the rotator 306 may be rotated using a first moving means (not shown) during the curing operation. The first moving means may be configured to rotate the rotator 306 at different speeds. In an embodiment, the first moving means may be configured to change a speed of the rotator 306 from a first speed to a second speed. In other embodiment, the first moving means may be configured to change a speed of the rotator 306 from the second speed to the first speed.

The rotator 306 may be configured to carry the coil from the input gate 302 to the output gate 304 through the processing zone of the curing assembly 106. The rotator 306 may be water cooled for neutralizing the coil for reducing the heating effects during the curing. Curing of the coils occurs in the processing zone. A gap H (Seen in FIG. 5) at the input of the processing zone is a predefined and fixed gap for the coil 312 to enter the processing zone easily. In an embodiment, such gap is of 51.4 mm. The curing may comprise different steps such as feeding of the coils, providing an inert environment to the coils, maintaining concentration of oxygen gas at a predefined level, emitting electrons, providing coolant via the rotator 306 to the coils while the coil is being cured. The step of providing the inert environment may comprise injecting nitrogen gas and maintaining a concentration of oxygen gas within the processing zone. The processing zone may comprise an emission zone. The emission zone may be defined as a region of the processing zone in which the electrons are emitted on the coil. In other words, the curing of the coils is performed in the emission zone.

In an embodiment, the movable part 104 may be configured to be displaced with respect to the fixed part 102 using a coupler 308. The apparatus 100 may include a second moving means to displace the movable part 104 with respect to the fixed part 102. In an embodiment, the movable part 104 may be configured to move between a first position and a second position. In other embodiment, the movable part 104 may be configured to move between a plurality of different positions.

In an embodiment, the movable part 104 comprises an accelerator 310. The accelerator 310 may be configured to emit electrons for curing the coils. In an embodiment, the accelerator 310 may comprise a chamber, a window, and a foil 316. The chamber may be configured to surround a plurality of components therewithin. The components may include a repeller plate, an electron gun assembly, and a filament. The electron gun assembly in association with the filament may be configured to generate an electron beam of high intensity using a high voltage. The repeller plate may be configured to repel the electrons that are bounced back to the chamber. The window is the only opening of the chamber for expelling the electron beam therethrough. The beam current is produced in correlation to the high voltage applied to the electron gun assembly. The foil 316 is placed adjacent the window for the electron beam to pass therethrough. The coil that is coated is to be placed in front of the foil 316 for the curing.

In an embodiment of the present disclosure, the movable part 104 may be configured to be at a first position and may be displaced at a second position with respect to the fixed part 102. At the first position, a first gap D1 (seen in FIG. 3) is created between the coil and the foil 316. In an exemplary embodiment, the first gap D1 is around 20 mm. In some embodiments of the present disclosure, the first gap D1 is suitable for the coil 312 to pass through the processing zone for curing.

After displacement of the movable part 104 from the first position to the second position, a second gap D2 (seen in FIG. 4) is created between the coil and the foil 316. In an exemplary embodiment, the second gap D2 is around 70 mm. It is to be noted that the values of the first gap D1 and the second gap D2 are exemplary and may vary in accordance with requirement of different apparatus without deterring from the scope of the invention.

In some embodiments of the present disclosure, the electron gun assembly and the filament are required to generate high intensity electron beam for curing of the coil which is coated using energy cured resins. The high intensity electron beam is generated using high voltage applied to the electron gun assembly, resulting in a beam current required for the curing of the coil.

Referring to FIG. 1, in an exemplary embodiment, the curing assembly 106 may be communicatively coupled with the microprocessor unit 108. The microprocessor unit 108 may be configured to monitor and control operation of the curing assembly 106 and the apparatus 100 for curing the coils.

In an embodiment of the present disclosure, nitrogen gas is injected inside the processing zone. The processing zone may comprise one or more injecting elements (not shown) for injecting nitrogen gas. The one or more injecting elements may be configured to keep the concentration of oxygen gas within a predefined concentration limit. In an example embodiment, the predefined concentration limit of oxygen gas may be within 100 to 150 ppm. In further embodiment, a concentration of oxygen gas may be configured to be kept below a certain level. In an example embodiment, the level of concentration of oxygen gas may be below 150 ppm. Such concentration of oxygen gas helps in reducing inhibitor effect for the free radicals that are responsible for propagating polymerization reaction.

The one or more sensors may monitor concentrations of nitrogen and oxygen gases. For the same, the one or more sensors may be configured to measure concentrations of nitrogen and oxygen gases. In an embodiment, such measurement may be performed periodically. In other embodiment, such measurement may be performed continuously. The one or more sensors may transmit the measured concentrations of nitrogen and oxygen gases to the microprocessor unit 108 for further processing.

In an embodiment, the microprocessor unit 108 may be communicatively coupled to the user interface 110. In an embodiment, the user interface 110 may be an input interface and may be configured to receive one or more inputs during the curing process. In another embodiment, the user interface 110 may be an output interface and may be configured to display one or more parameters during the curing process. In yet another embodiment, the user interface 110 may be an input as well as an output interface and may be configured to receive input as well as display one or more parameters during the curing process.

In some exemplary embodiments of the present disclosure, the user interface 110 may be configured to display values of a voltage applied to the apparatus 100, a beam current, a concentration of nitrogen and oxygen gases in the apparatus 100, and the like.

In other embodiments of the present disclosure, the user interface 110 may be configured to receive inputs of the values of voltage, the beam current, a desired concentration of nitrogen and oxygen gases for controlling the curing process, and the like.

In some embodiments of the present disclosure, the user interface 110 may be configured to receive inputs to control the operation of the rotator 306 and send the received inputs to the microprocessor unit 108. Based on the received inputs, the microprocessor unit 108 controls operation of the rotator 306 by giving a power to the first moving means.

In other embodiments of the present disclosure, the microprocessor unit 108 may be configured to detect when the values of any one of the voltage, the beam current, the concentration of nitrogen and oxygen gases exceed respective predefined ranges. The microprocessor unit 108 may instruct the user interface 110 to generate an alert. The generated alert may be an audio alert, a video alert, or a combination thereof.

In some embodiments of the present disclosure, the operation of the apparatus 100 may be controlled by a user. For instance, in cases when the values any one of the voltage, the beam current, or the concentration of nitrogen and oxygen gases exceed their predefined respective ranges, the user may directly turn OFF the apparatus 100 by turning OFF the power supply given to the apparatus 100.

In other embodiments, the apparatus 100 may include an OFF switch to turn OFF the apparatus 100 in case of generation of an alert. The OFF switch may be operated by a user for turning OFF the apparatus 100.

In some exemplary embodiments of the present disclosure, the first moving means and the second moving means may be a motor for rotating the rotator 306 and displacing the movable part 104 of the curing assembly 106, respectively.

In an embodiment, the apparatus 100 may comprise one or more means for preventing discharge of nitrogen from the processing zone of the apparatus 100.

The curing assembly 106 may comprise two positions during operation, a first position as seen in FIG. 3 and a second position as seen in FIG. 4. The first position is achieved during a first stage of operation and the second position is achieved during a second stage of operation.

Figure 2A:
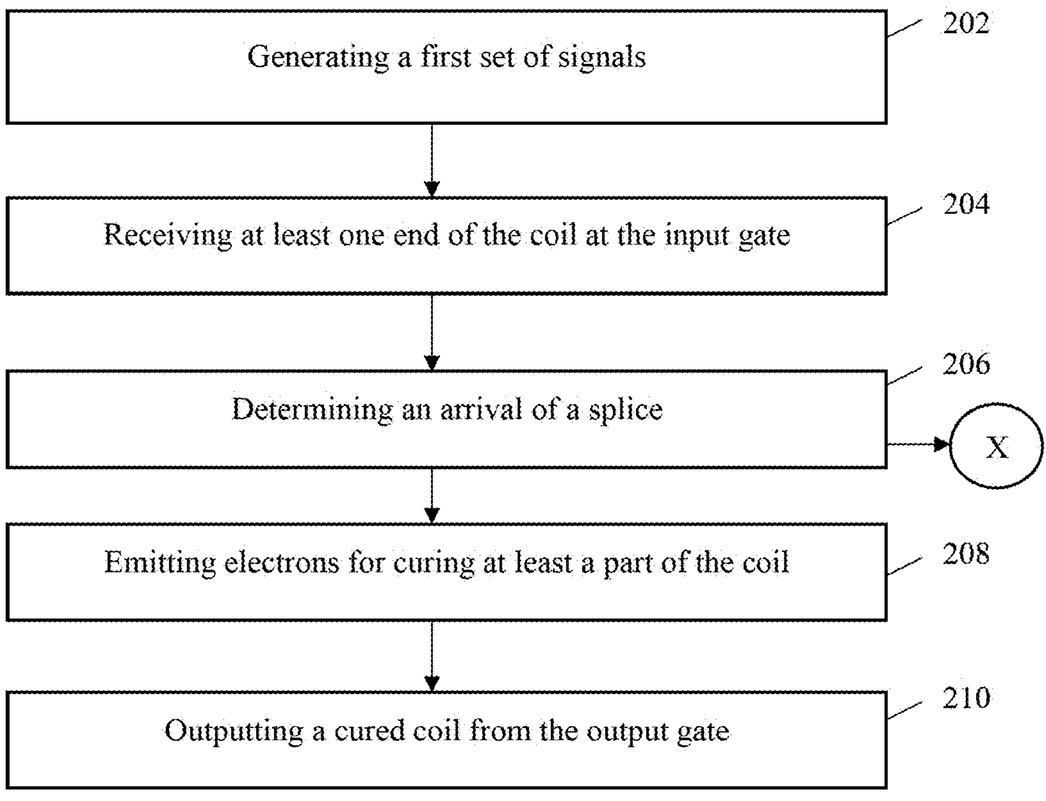
FIG. 2A shows an exemplary flowchart of a first stage of operation of a method for curing of coils in accordance with the present disclosure.
Figure 2B:
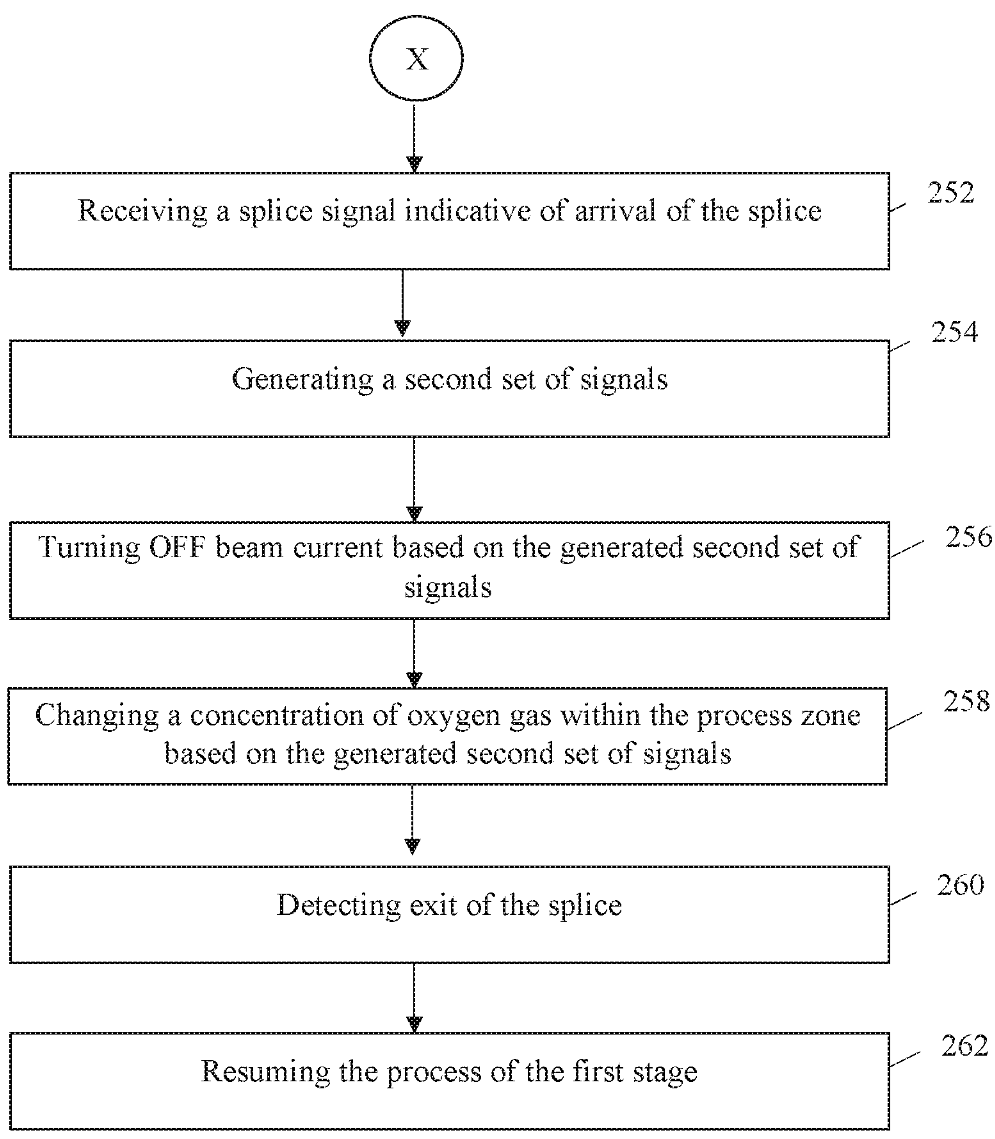
FIG. 2B shows an exemplary flowchart of a second stage of operation of a method for curing of coils in accordance with the present disclosure.

Referring to FIG. 2, an exemplary flowchart of a method 200 for curing of coils, in accordance with the present disclosure is disclosed. It is to be noted that the method may be performed on the apparatus 100 as disclosed in FIG. 1.

In an embodiment, the method 200 of curing the coils using an apparatus 100 may comprise two stages, a first stage indicating a normal operation and a second stage indicating a splice operation. In an embodiment, a coil 312 that is coated by the energy cured resins is being cured by the apparatus 100.

In the first stage or the normal operation, the method may include an initial step of turning ON the apparatus 100 by providing a voltage. The method may further comprise a step of injecting nitrogen gas to maintain a concentration of oxygen gas at a predefined level. In an embodiment, the predefined level of concentration of the oxygen gas is 100 to 150 ppm.

In step 202, the method includes the step of generating a first set of signals by the microprocessor unit 108 for operation of the apparatus 100 in the first stage. The first set of signals may comprise a first speed signal for rotating the rotator 306 at a first speed, a first displacement signal for keeping the movable part 104 of the curing assembly 106 at the first position, a first beam signal for generation of the electron beam of a first value, and a first concentration signal to maintain the concentration of the oxygen gas within the processing zone at a first concentration level. The microprocessor unit 108 may transmit the generated first set of signals to corresponding components. For instance, the first speed signal is transmitted to the first moving means for rotating the rotator at the first speed. In an embodiment, the first speed is 100 meters/min. The first displacement signal is transmitted to the second moving means for maintaining the position of the movable part at the first position. The first beam signal is transmitted to the accelerator 310 for generating a beam current of a first value. The first concentration signal is transmitted to the one or more injecting elements for maintaining concentration of nitrogen oxygen gas at the first concentration level.

In step 204, the method 200 may include the step of receiving at least one end of a coil 312 for curing at the input gate. A direction of the coil 312 entering the apparatus 100 is indicated by A (seen in FIGS. 1 and 3-4). In step 206, the microprocessor unit 108 may receive a signal related to the coil and the microprocessor unit 108 determines an arrival of a splice based on the received signal. If the arrival of the splice is not determined, the method continues in the first stage in steps 208-210. If the arrival of the splice is determined, the second stage of the method is performed, indicated by X in FIG. 2B, in steps 252-260.

If the arrival of the splice is not detected, then the first operation continues to step 208. In step 208, the coil reaches to the emission zone in which the accelerator 310 emits the electrons on the coil for curing. In the emission zone, as discussed hereinabove, a gap between a coil 312 and a foil 316 is a first gap D1. In an embodiment, the first gap D1 is around 20 mm. In some embodiments of the present disclosure, the first gap D1 is suitable for the coil 312 to pass through the processing zone for curing. The high voltage electron beam is generated by the electron gun assembly and the filament when a high voltage of 125 to 150 kV is applied to the electron gun assembly, resulting in emission of high electron beam, which corresponds to high beam current. The coil 312 that is arrived in front of the foil 316 is provided with the high beam current by the accelerator 310. The high intensity electron beam provides a dose that is required for the coil 312 to cure. In an embodiment, the dose is defined as energy absorbed per unit mass and is measured in terms of megarads (Mrad). In an exemplary embodiment, the dose that is provided for curing is around 50 kGy. The dose is slaved to a line speed. In other words, the dose is coupled to the line speed, and is controlled on basis of the line speed by the following relationship:

$$D = \frac{k * I}{V}$$

where D is the Dose in kGy,

I is the beam current in mA,

V is the product velocity in meters/minute, k is the proportionality factor having units of kGy/mpm/mA.

On completion of curing of the coils in the emission zone, a cured coil 314 is generated. The cured coil 314 is moved towards the output gate 304 for exit as represented in step 210. A direction of the cured coil 314 exiting the apparatus 100 is indicated by B (as seen in FIGS. 1 and 3-4).

Figure 5:
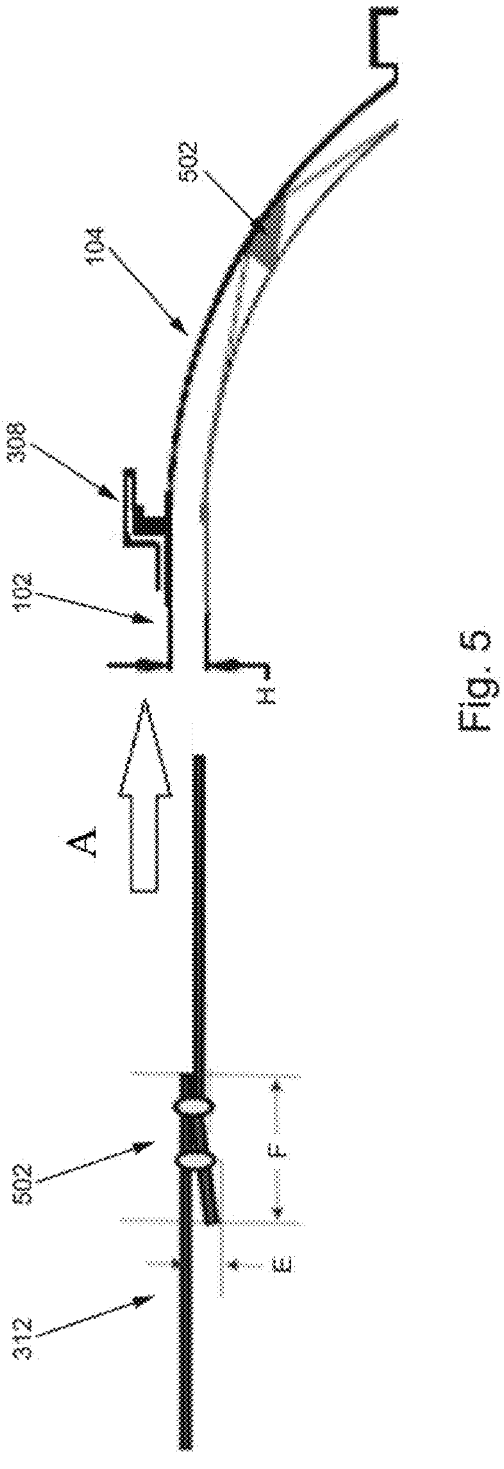
FIG. 5 schematically shows an exemplary splice approaching an apparatus, and a change in thickness of a coil in presence of the splice in accordance with the present disclosure.

Referring back to the step 206, if the arrival of the splice is detected, a second stage of the operation is performed. The second stage corresponds to the splice operation, where a splice arrives at the input gate 302 of the apparatus 100. As explained hereinabove, a splice is a part of the coil where two rolls of coils are joined together. FIG. 5 illustrates an exemplary splice 502 at the input gate 302 of the apparatus 100 and a change in thickness of the coil 312 with effect from the splice 502. In the curing operation, a thickness E of a part of the coil 312 having splice 502 is around 50 mm, and a length F of such splice 502 is around 300 mm-500 mm.

In the second stage, the microprocessor unit 108 may receive a splice signal indicating an arrival of the splice 502 in step 252. In an embodiment, the microprocessor unit 108 may receive the splice signal from a splice detector (not shown). In another embodiment, a user may provide the splice signal to the microprocessor unit 108 using the user interface 110. In yet another embodiment, the apparatus 100 may comprise a first switch to indicate the arrival of the splice 502 at the input gate 302. The first switch may be operated by the user. The microprocessor unit 108, on receiving the splice signal, generates a second set of signals in step 254. The second set of signals are transmitted to the curing assembly 106 for the splice operation. The second set of signals may include a second speed signal, a second beam signal, a second displacement signal and a second concentration signal. As the splice 502 enters the processing zone of the apparatus 100 through the input gate 302, the second speed signal is received by the first moving means to change the speed of the rotator 306 from the first speed to a second speed. In an exemplary embodiment, the second speed of the rotator 306 being 50 meters/minute.

In step 256, the beam current is turned OFF based on the second set of signals, more particularly the second beam signal. In step 258, the second concentration signal is transmitted to the nitrogen injecting elements for changing the concentration of oxygen in the processing zone from a first level to a second level. The second level is indicative of higher concentration than the first level. The first level corresponds to a concentration of oxygen in the range of 100 to 150 ppm. The second displacement signal is transmitted to the second moving means for displacing the movable part 104 with respect to the fixed part 102. In an embodiment, the movable part 104 of the curing assembly 106 is displaced from a first position to a second position based on the second displacement signal. The second position of the movable part 104 is at a predefined distance C from the fixed part 102 i.e., 50 mm. The second position of the movable part 104 displaces the foil 316 of the accelerator 310 from the coil to obtain a second gap D2 as shown in FIG. 4. In other words, the second gap D2 is created in the emission zone. In an embodiment, the second gap D2 is around 70 mm. Because of such second gap D2 in the emission zone, the splice 502 of width between 30 to 50 mm easily passes through the emission zone.

In step 260, an exit of the splice 502 is detected through the output gate 304 of the apparatus 100. The exit of the splice indicates that a second or new coil is configured to be cured using the apparatus 100. In an embodiment, the microprocessor unit 108 may receive an exit signal indicating exit of the splice 502 from the apparatus 100. In another embodiment, the microprocessor may wait for a predefined time for the exit of the splice 502. An example of such predefined time is 3.5 seconds. In yet another embodiment, the apparatus 100 may comprise a second switch for indicating exit of the splice 502. The second switch may be operated by the user. In an embodiment, the apparatus 100 may comprise a single switch which works as a first switch as well as the second switch to indicate an arrival or an exit of the splice 502.

In step 262, after the splice 502 passes through the apparatus 100, the microprocessor unit 108 may resume the first stage of operation. In other words, the method jumps at step 202. Accordingly, the first set of signals may be generated by the microprocessor unit 108 for operation of the apparatus 100 in the first stage or the normal condition.

The generated first set of signals may be transmitted to the corresponding components of the curing assembly 106 for resuming the normal operation. The movable part 104 is displaced from the second position to the first position via the first moving means. The rotator 306 is rotated at the first speed by the first moving means. The beam current is turned ON and the concentration of oxygen is brought to the first level from the second level by the nitrogen injecting elements. Accordingly, the normal operation of curing by the apparatus 100 is resumed.

Hence, in the second stage or the splice operation, only the beam current is turned OFF. The other parameters such as inerting by nitrogen gas, or high voltage are kept ON. Hence, for achieving a steady state condition after the second stage, only the beam current has to be turned ON. In other words, the apparatus 100 may achieve the steady state condition quickly using the abovementioned method. The steady state condition is referred as a condition is which the apparatus runs in a normal stage without any specific change in any of the parameters. In an embodiment, a time require for the apparatus 100 to change from the second stage to the first stage of operation or to achieve the steady state condition after the second stage is around 3.5 sec, which is significantly less as compared to the existing time.

It is to be noted that even though the specific steps are disclosed in the method, one or more steps may be separated or combined without deterring to the scope of the present disclosure.

In some embodiment of the present disclosure, the apparatus 100 is in communication with an automatic winding and splicing system for continuously providing coils to apparatus 100. Further, the automatic winding and splicing system is configured to form a splice with two coil rolls at a time. When a first coil that is being processed by the apparatus 100 is about to get finish, the automatic winding and splicing system provides the apparatus 100 with a splice between the first coil and a second coil.

In some embodiment of the present disclosure, the method used for coil coating is any one of a galvanizing, roll coating, electrochemical coatings, vapor deposition, conversion coatings or thermal spraying.

In some embodiment of the present disclosure, a coil coating apparatus 100 is placed prior to the apparatus 100, for coating the coils. A coating head in the coil coating apparatus 100 is configured to coat the coil before the coil enters into the apparatus 100.

In some embodiment of the present disclosure, as the splice 502 arrives, the user using the user interface 110 may stop the operation of coating.

Accordingly, the present invention is advantageous over the prior existing technologies in terms of less wastage of the coils. As in the prior existing technologies, the apparatus 100 is turned OFF when a splice 502 arrives. In particular, the beam current, the high voltage, and injection of nitrogen gas are stopped. Hence, after passing of the splice 502, the time required to turn all the components ON, and to achieve the steady state operation of the apparatus is more. In other words, the time required to achieve the steady state condition using such existing method is as high as 30 secs, while the coil is being rotated. This results in wastage of the coil as the apparatus 100 takes a significant time to start and achieve the beam current required for providing dose for curing. The total wastage in this case is around 25 to 30 meters per roll with a speed of 50 meters/minute. For the 8-hour shift, the wastage is estimated to be 120 Linear Meters (LM) per shift. The present disclosure is advantageous in terms of providing faster processing time for the apparatus 100. The apparatus 100 takes less time to restart for providing dose to the coil for curing. The time that is estimated for the apparatus 100 to restart after the departure of the splice is only 3.5 seconds. The wastage of the coil that is uncoated is less than 3 LM. For an 8-hour shift, with a speed of 50 meters/minute the wastage of the coil is less than 12 LM per roll. Therefore, there is almost 10 times reduction in waste per shift that is produced from the coils that are uncoated and uncured.

All ranges cited herein shall be considered inclusive unless otherwise indicated. Although the present description has been presented in terms of certain preferred embodiments, various features of separate embodiments can be combined to form additional embodiments not expressly described. Moreover, other embodiments apparent to those of ordinary skill in the art after reading this disclosure are also within the scope of this description. Furthermore, not all of the features, aspects and advantages are necessarily required to practice the present invention. Thus, while the above detailed description has shown, described, and pointed out novel features as applied to various embodiments, it will be understood that various omissions, substitutions, and changes in the form and details of the apparatus or process illustrated may be made by those of ordinary skill in the technology without departing from the spirit of the invention. The embodiments described above are to be considered in all respects as illustrative only and not restrictive in any manner. The scope of the invention is indicated by the following claims, informed by the above descriptions.

What is claimed is:

1. A method for curing coils, the method being performed on an electron beam apparatus having an input gate, and an output gate, an emission zone disposed therebetween, the method comprising:

receiving at least one coil at the input gate;

rotating a rotator configured to cause the at least one coil to be carried from the input gate, through the emission zone for curing of the coil, and through the output gate;

curing at least part of the coil in the emission zone to generate a cured coil, the curing caused by an electron beam generated as a function of a given voltage applied to an electron gun assembly;

determining an arrival of a splice of the coil at the input gate, the splice being a common portion between the at least one first coil and a respective at least one second coil;

responsive to determining the arrival of the splice, adjusting at least one parameter of the apparatus while the splice is between the input gate and the output gate, wherein adjusting the at least one parameter comprises adjusting a position of a movable part of the electron beam apparatus from a first position to a second position to enable the splice to pass through the emission zone, wherein the given voltage is unchanged; and carrying the cured coil through the output gate.

2. The method of claim 1, wherein determining the arrival of the splice comprises:

receiving a first splice signal indicating the arrival of the splice.

3. The method of claim 1, wherein adjusting the at least one parameter of the apparatus further comprises adjusting a speed of the rotator from a first speed to a second speed.

4. The method of claim 1, wherein the second position of the movable part is a predefined distance from a fixed part of the electron beam apparatus.

5. The method of claim 1, wherein the position of the movable part being in the first position results in a first gap in the emission zone, and wherein the position of the movable part being in the second position results in a second gap in the emission zone, the second gap in the emission zone being obtained by displacing a foil of an accelerator in the emission zone from a coil.

6. The method of claim 5, wherein the second gap is around 70 mm.

7. The method of claim 1, wherein adjusting the at least one parameter of the apparatus further comprises adjusting a beam signal configured to control an electron beam current.

8. The method of claim 7, wherein adjusting the beam signal turns the electron beam current OFF.

9. The method of claim 1, wherein adjusting the at least one parameter of the apparatus further comprises adjusting a concentration level of oxygen gas within the emission zone from a first concentration level to a second concentration level.

10. The method of claim 9, wherein the second concentration level is higher than the first concentration level.

11. The method of claim 9, wherein the first concentration level is in the range of 100 ppm to 150 ppm.

12. The method of claim 1, wherein the adjusting of the at least one parameter of the apparatus is performed by a microprocessor.

13. The method of claim 2, wherein the first splice signal is received from a splice switch.

14. The method of claim 1, further comprising determining the exit of the splice.

15. The method of claim 14, wherein the determining the exit of the splice comprises waiting a predefined time from the determining of the arrival of the splice.

16. The method of claim 15, wherein the predefined time is 3.5 seconds.

17. The method of claim 14, wherein the determining the exit of the splice comprises receiving a second splice signal indicating the exit of the splice.

18. The method of claim 17, wherein the second splice signal is received from a switch.

19. The method of claim 17, further comprising reverting the at least one parameter of the apparatus from the adjusted at least one parameter on receiving the second splice signal.

* * * * *